United States Patent [19]

Kanda et al.

[11] Patent Number: 4,937,173

[45] Date of Patent: Jun. 26, 1990

[54] RADIATION CURABLE LIQUID RESIN COMPOSITION CONTAINING MICROPARTICLES

[75] Inventors: Kazunori Kanda, Yao; Ryuzo Mizuguchi, Yawata, both of Japan

[73] Assignee: Nippon Paint Co., Ltd., Osaka, Japan

[21] Appl. No.: 283,716

[22] Filed: Dec. 13, 1988

Related U.S. Application Data

[63] Continuation-in-part of Ser. No. 84,046, Aug. 11, 1987, abandoned, which is a continuation of Ser. No. 817,654, Jan. 10, 1986, abandoned.

[30] Foreign Application Priority Data

Jan. 10, 1985 [JP]  Japan ..................................... 62-3070

[51] Int. Cl.$^5$ ............................................... G03C 1/68
[52] U.S. Cl. .................................. 430/281; 430/284; 430/285; 430/286; 522/93; 522/95; 522/101; 522/102; 524/457; 525/426; 526/201; 526/214
[58] Field of Search ............... 430/281, 284, 285, 286, 430/287; 522/93, 96, 101, 102, 106; 524/467; 525/426; 526/201, 214

[56] References Cited

U.S. PATENT DOCUMENTS

| | | | |
|---|---|---|---|
| 4,186,069 | 1/1980 | Muzyczke et al. | 430/281 |
| 4,276,366 | 6/1981 | McCartin et al. | 430/281 |
| 4,362,808 | 12/1982 | Otthofer | 430/281 |
| 4,414,278 | 11/1983 | Cohen et al. | 428/402 |
| 4,508,814 | 4/1985 | Sakurai et al. | 430/281 |
| 4,517,177 | 5/1985 | Lynch et al. | 430/281 |
| 4,522,910 | 6/1985 | Hallman | 430/281 |
| 4,550,073 | 10/1985 | Neiss et al. | 430/273 |
| 4,551,415 | 1/1985 | Cohen et al. | 430/281 |

OTHER PUBLICATIONS

Polymerization Mechanisms and Processes, pp. 742–744.

*Primary Examiner*—Jack P. Brammer
*Attorney, Agent, or Firm*—Millen, White & Zelano

[57] ABSTRACT

A radiation curable liquid resin composition comprising a radiation curable liquid base resin and polymer microparticles having an average particle size from 0.01 to 0.6 microns. The incorporation of polymer microparticles to the base resin may improve the rheological property of the liquid composition and also the physical properties of cured film therefrom.

11 Claims, No Drawings

RADIATION CURABLE LIQUID RESIN COMPOSITION CONTAINING MICROPARTICLES

CROSS REFERENCE TO RELATED APPLICATION

This is a continuation-in-part of application Ser. No. 084,046, filed Aug. 11, 1987, now abandoned, which is, in turn, a continuation of application Ser. No. 817,654, filed, Jan. 10, 1986, now abandoned.

BACKGROUND OF THE INVENTION

Liquid resin composition which cure upon irradiation with high energy radiation have many important advantages. Since they may be cured within a few seconds without heating, they may be applied on thermally deformable substrates and do not require large equipment for curing. Since they are usually free from any volatile solvent and utilize electric energy for curing, they do not evolve harmful pollutants to the environment. When they are used as a photosensitive material, a high quality image may be reproduced by using short wavelength radiation. Consequently, they find a wide variety of uses in the coating, electronic, printing and other industry as UV or electron beam curable coating compositions, photoresists, electron beam resists, X-ray resists, printing plate making materials and the like.

As is well-known, these radiation curable compositions are normally liquid prior to curing without using any volatile solvent in order that steps for removing solvent and setting the applied composition may be obviated. However, they have to possess a suitable viscosity level to impart them with desired workability without using such volatile solvent. This prevents prior art radiation curable compositions from being applied in greater film thicknesses in a single coating operation. This is because the conventional compositions tend to run with the increase in the amount applied per unit area. The run property may be improved by the incorporation of fine silica particles or various body pigments. The addition of these inorganic fillers, however, tends to adversely affect the weather resistance, appearance or other physical properties of the resulting film. Besides, these inorganic particles tend to cause absorption or scattering of radiation applied because of the difference in refractive index, particle size distribution and chemical constitution between the inorganic particles and the matrix resin. This can result in uneven dose of high energy radiation which, in turn, may produce insufficiently cured portions or curing may take place in undesired areas.

BRIEF SUMMARY OF THE INVENTION

It is, therefore, a principal object of the present invention to provide a radiation curable resin composition which can eliminate or ameliorate the above-discussed disadvantages of conventional compositions. Other objects and advantages of the present invention will become apparent to those skilled in the art as the description proceeds.

These and other objects and advantages of the present invention are accomplished by providing a radiation curable composition comprising (a) a radiation curable, liquid matrix resin selected from the group consisting of unsaturated polyester resin, urethane acrylate resins, epoxy acrylate resins, polyester acrylate resins, spirane acrylate resins, and mixtures of an ethylenically unsaturated monomer with said resin, and (b) 0.1 to 50% by weight based on the total solids content of the resin composition of microparticles having a particle size from 0.01 to 0.6 microns of an internally cross-linked copolymer of a mixture of ethylenically unsaturated monomers comprising a monomer having at least two polymerizable site per molecule or a combination of two monomers having mutually reactive groups, said polymer microparticles having physically adhered to the surfaces thereof an amphoionic group-containing water soluble resin.

Examples of high energy radiation include ultraviolet (UV) rays, electron beams, X-rays and other ionizing radiation. UV rays having a wavelength of 100-400 nm, preferably 200-300 nm (known as deep UV rays) may be used. These UV rays possess an energy level as high as 70-300 KCal/mole at which dissociation of molecules of ethylenically unsaturated organic compounds occurs. Therefore, the UV light is capable of producing free radicals and thus initiating addition polymerization of the composition of this invention. Electron beams, X-rays and other ionizing radiation (including $\alpha$-, $\beta$- and $\gamma$-rays and hard X-rays among which $\beta$-rays having suitable transmission properties may preferably be used as accelerated electron beams) are capable of producing ions, excited molecules and free radicals to initiate addition polymerization of the composition of this invention.

Preferably, the polymer microparticles are present in the final composition in amounts from 0.2 to 30% by weight based on the total solids content thereof.

According to the present invention, the viscosity of the resulting radiation curable resin composition may be controlled to exhibit a yield value by the incorporation of polymer microparticles. In other words, the composition has a high apparent viscosity when stationary but the apparent viscosity decreases sharply when a shear force is exerted. This enables the composition of this invention to be applied in greater film thicknesses by a single coating operation without run due to the gravity flow, while retaining a proper workability.

The polymer microparticles have chemical constitution and optical properties similar to those of matrix resin and thus they do not adversely affect the transparency and the sensitivity to radiation of the composition of this invention. This avoids insufficient curing or curing of undesired areas from occurring and the appearance of finally cured film is not adversely affected.

The composition of this invention exhibits improved physical properties such as tensile strength, hardness, adhesion strength, flexural strength, abration resistance and the like when compared with the corresponding composition free from the polymer microparticles. This may be explained by a physical interaction between the polymer microparticles and the matrix resin so that stresses are relaxed when applied externally.

DETAILED DISCUSSION

One method for preparing the polymer microparticles includes the steps of emulsion polymerizing a mixture of ethylenically unsaturated monomers in an aqueous medium, and removing water from the emulsion by means of solvent substitution, azeotropic distillation, centrifugation, drying and the like. As an emulsifier, ampho-ionic group-containing, water-soluble resins as disclosed in Japanese Laid Open Patent Application No. 58-129066, ampho-ionic group-containing alkyd resins disclosed in U.S. Pat. No. 4,322,324 and amphoteric amino sulfonate derivatives of epoxy resins disclosed in U.S. Pat. No. 4,379,872 may advantageously be employed.

The average size of the polymer microparticles varies with the particular polymerization method. Thus, the emulsion polymerization method is suitable for the range of 0.01 to 0.6 micron size.

The starting monomer mixture contains, at least as a portion thereof, a monomer having at least two polymerizable sites per molecule or a combination of two monomers having mutually reactive groups to give microparticles which are internally cross-linked.

The polymeric microparticles of the present invention have a diameter of about 0.01 to 0.6 microns for retaining a good dispersibility, reactivity and stability in the crosslinkable polymer system.

Examples of ethylenically unsaturated comonomers used for the production of microparticles include methyl (meth)acrylate, ethyl (meth)acrylate, n-butyl (meth)acrylate, isobutyl (meth)acrylate, 2-ethylhexyl (meth)acrylate, styrene, α-methylstyrene, vinyltoluene, t-butylstyrene, ethylene, propylene, vinyl acetate, vinyl propionate, acrylonitrile, methacrylonitrile, dimethylaminoethyl (meth)acrylate and the like. Two or more comonomers may be combined.

Cross-linking comonomers include a monomer having at least two ethylenically unsaturated bonds per molecule and the combination of two different monomers having mutually reactive groups.

Monomers having at least two polymerization sites may typically be represented by esters of a polyhydric alcohol with an ethylenically unsaturated monocarboxylic acid, esters of an ethylenically unsaturated monoalcohol with a polycarboxylic acid and aromatic compounds having at least two vinyl substituents. Specific examples thereof include ethylene glycol diacrylate, ethylene glycol dimethacrylate, triethylene glycol dimethacrylate, tetraethylene glycol dimethacrylate, 1,3-butylene glycol dimethacrylate, trimethylolpropane triacrylate, trimethylolpropane trimethacrylate, 1,4-butanediol diacrylate, neopentyl glycol diacrylate, 1,6-hexanediol diacrylate, pentaerythritol diacrylate, pentaerythritol triacrylate, pentaerythritol tetracrylate, pentaerythritol dimethacrylate, pentaerythritol trimethacrylate, pentaerythritol tetramethacrylate, glycerol diacrylate, glycerol allyloxy dimethacrylate, 1,1,1-tris(hydroxymethyl)ethane diacrylate, 1,1,1-tris(hydroxymethyl)ethane triacrylate, 1,1,1-tris(hydroxymethy)ethane dimethacrylate, 1,1,1-tris(hydroxymethyl)ethane trimethacrylate, 1,1,1-tris(hydroxymethyl)propane diacrylate, 1,1,1-tris(hydroxymethyl)propane triacrylate, 1,1,1-tris(hydroxymethyl)propane dimethacrylate, 1,1,1-tris(hydroxymethyl)propane trimethacrylate, triallyl cyanurate, triallyl isocyanurate, triallyl trimellitate, diallyl phthalate, diallyl terephthalate and divinyl benzene.

Combinations of two monomers having mutually reactive groups may be used in place of, or in addition to monomers having two or more polymerization sites. For example, monomers having a glycidyl group such as glycidyl acrylate or methacrylate may be combined with carboxyl group-containing monomers such as acrylic, methacrylic or crotonic acid. Also, hydroxyl group-containing monomers such as 2-hydroxyethyl (meth)acrylate, 2-hydroxypropyl (meth)acrylate, hydroxybutyl (meth)acrylate, allyl alcohol or methallyl alcohol may be combined with isocyanato group-containing monomers such as vinyl isocyanate or isopropenyl isocyanate.

Polymer microparticles prepared in an aqueous medium may be isolated by such conventional means as filtration, spray drying, lyophilization and the like, and used directly. Alternatively, the dispersion containing the microgel particles may be subjected to solvent substitution and the resulting dispersion in a new medium may be incorporated in the composition of this invention.

It will be appreciated that the above steps for producing the polymer microparticles will retain some of the amphoionic group-containing water-soluble resin on the surfaces of polymer microparticles. It is believed that the amphoionic group-containing resin not only plays a role as an emulsifier but also effectively prevents the resulting polymer microparticles from coalescing together into secondary particles of larger sizes after being physically adhered to the surfaces of the polymer microparticles.

The particle size distribution of the polymer microparticles may be regulated by the selection of the polymerization method or by suitably mixing particles having different average particles sizes to achieve optimum rheology control of the composition containing the same. Furthermore, the physico-chemical properties of the polymer microparticles such as glass transition temperature, solubility parameter, refractive index may be controlled as desired by suitably selecting their monomeric formulations. Polymer microparticles having on their surfaces functional or unsaturated groups capable of co-reacting with such groups possessed by other polymer microparticles or matrix resin may be incorporated to enhance the interaction between the polymer microparticles themselves or with the matrix resin. The polymer microparticles may also carry on their surfaces or interior a substance which promotes the radiation polymerization reaction such as photosensitizers or a substance which improves properties of cured composition such as stabilizers.

The proportion of polymer microparticles in the composition of the present invention generally ranges from 0.1 to 50%, preferably from 0.2 to 30% by weight of the total solids content of the composition to achieve optimum rheology control and improved physical properties.

A variety of radiation curable liquid resins are known. The base liquid resin to be employed in the present invention may be selected from these known resins depending upon its intended ultimate use. For example, for use as a resist or plate making material, those capable of selectively removing unexposed areas from a base sheet with water, an alkali, an acid or an organic solvent are employed to leave images which have been exposed to high energy radiation.

Typical examples of high energy radiation curable resins are those referred to as photosensitive or photocurable resins. These resins consist of (a) film-forming polymers or oligomers capable of cross-linking through photochemical reactions, optionally in admixture with (b) photo-polymerizable monomers as a reactive diluent, (c) photo-polymerization initiators or photosensitizers, and (d) heat-polymerization inhibitors or stabilizers. The resins may optionally contain further ingredients such as photosensitizer enhancers, colorants and other additives as desired.

Examples of film-forming polymers or oligomers include unsaturated polyester resins, urethane acrylate resins, epoxy acrylate resins, polyester acrylate resins, spiran acrylate resins and the like.

Examples of photo-polymerizable monomers include styrene, vinyltoluene, divinylbenzene, vinyl acetate, (meth)acrylonitrile, esters of (meth)acrylic acid such as methyl (meth)acrylate, ethyl (meth)acrylate, butyl (meth)acrylate, 2-ethylhexyl (meth)acrylate, glycidyl (meth)acrylate, ethyleneglycol di-(meth)acrylate and trimethylolpropane tri-(meth)acrylate, diethyl itaconate, dibutyl itaconate, diethyl fumarate, diethyl maleate and the like.

Examples of photosensitizers includes benzoin, benzoin methyl ether, benzoin propyl ether, benzoin butyl ether, benzophenone, diacetyl, benzil, dibutyl disulfide, dibenzyl disulfide and the like.

Examples of heat-polymerization inhibitors include hydroquinone, t-butylhydroquinone, p-methoxyphenol, catechol, benzoquinone and the like.

Other radiation curable resins have similar compositions to the above-discussed photocurable resins except that they do not contain photosensitizers. Since these radiation curable resins are well-known in the art and do not constitute a part of the present invention, further explanation thereon will not be needed to those skilled in the art. The essential feature of the present invention resides in the use of polymer microparticles for controlling rheological properties of known and conventional radiation curable liquid base resins instead of using inorganic microparticles to thereby not only eliminate or ameliorate various disadvantages associated with such inorganic microparticles but also improve physical properties of cured products compared with the corresponding formulations free from such polymer microparticles.

The compositions of this invention are therefore particularly useful in a number of its applications, for example, as plate making materials or inks used in the printing industry; as coating compositions, packaging materials or adhesives; as resists, dry films or sealants in processing electronic parts such as shadow masks, printed circuit boards, integrated circuits, LSI circuits and the like; as photoresists used in other fields; as textile treating agents; as photocurable compositions for treating dental caries; and as enzyme immobilizing compositions.

The following examples are intended to illustrate the present invention in further detail. In these examples, all parts and percents are by weight unless otherwise indicated.

EXAMPLE 1

Preparation of Emulsifier

To a two liter flask having stirring means, a reflux condenser, temperature-control means, a nitrogen gas-introducing tube and a decanter were added 134 parts of N,N-bis(hydroxyethyl)taurine, 130 parts of neopentyl glycol, 236 parts of azelaic acid, 186 parts of phthalic anhydride, and 27 parts of xylene. The mixture was refluxed and water was removed as an azoetropic mixture with xylene. The temperature was raised to 190° C. over 2 hours and the reaction was continued with stirring until an acid number of 145 was reached.

The reaction product was cooled to 140° C. and 314 parts of CARDURA E-10(glycidyl versatate, Shell Chemical Company) was added dropwise over 30 minutes at 140° C. The reaction was continued for additional two hours with stirring. A polyester resin having an acid number of 59, a hydroxyl number of 90 and a number average molecular weight ($\overline{Mn}$) of 1054 was obtained.

EXAMPLE 2

Preparation of Polymer Microparticles

To a one liter flask equipped with stirring means, cooling means and temperature-control means were added 380 parts of deionized water, 50 parts of the emulsifier resin prepared in Example 1 and 7 parts of dimethylethanolamine. The mixture was stirred at 80° C. to make a solution. To the solution was added a solution of 2.5 parts of azobiscyanovaleric acid in 50 parts of water containing 1.6 parts of dimethylethanolamine. Then a monomer mixture consisting of 118 parts of styrene, 118 parts of ethyleneglycol dimethacrylate and 14 parts of 2-hydroxyethyl acrylate was added dropwise over 90 minutes. Stirring was continued for additional 90 minutes to give a polymer microparticle dispersion having a nonvolatile content of 43% and an average particles size of 45 millimicrons. Polymer microparticles were obtained by lyophilizing the resulting polymer dispersion.

EXAMPLE 3

Preparation of Polyester Acrylate Oligomer

A flask equipped with stirring means, cooling means and temperature-control means was charged with 134 parts of trimethylolpropane, 462 parts of hexahydrophthalic acid and 30.5 parts of toluene. The mixture was reacted at 150° C. for 2 hours. Then 162 parts of butyl acetate and 2 parts of hydroquinone were added to the mixture. A mixture of 426 parts of glycidyl methacrylate, 1 part of hydroquinone, 5 parts of dibutyltindilaurate and 64 parts of butyl acetate was added dropwise over 5 hours while stirring at 110° C. The reaction was continued at the same temperature for additional 7 hours with stirring to give a resin solution having a solid content of 79% and an $\overline{Mn}$ of 1016. This product is hereinafter referred to as "Resin Composition (A)".

EXAMPLE 4

20 parts of polymer particles having an average particle size of 45 millimicrons prepared in Example 1 were dispersed in 40 parts of isopropyl alcohol placed in a stainless steel beaker. To the beaker were introduced 253 parts of Resin Composition (A) prepared in Example 3 and 4 parts of benzoin methyl ether. Then the mixture was dispersed for 30 minutes by a laboratory disperser to give a photocurable resin composition.

The photocurable resin composition was applied on a clean glass plate to a dry film thickness of 200 microns using a doctor blade, allowed to stand for 2 hours at room temperature and then irradiated with UV light under the conditions set forth below. The resulting cured film was almost transparent and tack-free on finger testing.

A specimen for tensile testing was taken by stripping the film from the glass substrate and tested under the conditions set forth below. The specimen exhibited an initial Young's modulus of 25 kg/mm$^2$, an elongation of 41% and a breaking strength of 0.99 kg/mm$^2$. The maximum film thickness against run in the vertical direction of this composition was 180 microns.

Conditions For Irradiating With UV Light

A high pressure mercury lamp (Nippon Storage Battery Co., Ltd., Model HI-20N, 80 W/cm, equipped with a reflector beam collector) was placed over a conveyer at a height of 80 cm with the orientation of the longitudinal axis of the lamp being perpendicular to the moving direction of the conveyer. The coated sample was passed under the lamp at a speed of 5 m/minutes.

Conditions For Tensile Testing

Using TENSILON tester (Model HI-100, Toyo Baldwin Co., Ltd.), a test was made on a film having a length of 50 mm and a width of 10 mm at a pulling rate of 50 mm/minutes.

COMPARATIVE EXAMPLE 1

The procedure of Example 4 was repeated except that 20 parts of polymer microparticles were replaced with 20 parts of calcium carbonate particles having an average particle size of 40 millimicrons (TM TOYOMAITY, Toyo Denka Co., Ltd.). The resulting cured film was opaque and white and retained some tackiness upon finger testing.

COMPARATIVE EXAMPLE 2

The procedure of Example 4 was repeated except that the polymer microparticles dispersed in isopropyl alcohol were not incorporated. The resulting cured film exhibited an initial Young's modulus of 23 kg/mm$^2$, an elongation of 29% and a breaking strength of 0.83 kg/mm$^2$. The maximum film thickness against run in vertical direction was 90 microns.

We claim:

1. In a radiation curable composition comprising a radiation curable resin liquid selected from the group consisting of unsaturated polyester resins, urethane acrylate resins, epoxy acrylate resins, polyester acrylate resins, spirane acrylate resins, and mixtures of an ethylenically unsaturated monomer with said resins, and 0.1 to 50% by weight of the total solids content of the composition of cross-linked polymer microparticles prepared by polymerizing (a) a mixture of ethylenically unsaturated monomers containing, as cross-linked agent, a monomer having at least two polymerizable sites per molecule or (b) a mixture of monomer having mutually reactive groups, in an aqueous emulsion containing in the aqueous phase an emulsifier, and then removing water from the resulting emulsion by filtration, spray drying, lyophilization or solvent substitution, the improvement wherein the microparticles have a particle size of from 0.1 to 0.6 microns and are produced by emulsion polymerization employing as emulsifier, a water soluble amphoionic group-containing acrylic, alkyd, or epoxy resin, which resin is retained on the surfaces of the microparticles.

2. The radiation curable liquid resin composition according to claim 1, containing a solvent for said matrix resin.

3. A radiation curable liquid resin composition according to claim 1, wherein the amount of said microparticles is from 0.2 to 30% by weight based on the total solids content of said composition.

4. The radiation curable liquid resin composition according to claim 1, which is curable by UV rays.

5. The radiation curable liquid resin composition according to claim 4, containing a photosensitizer.

6. The radiation curable liquid resin composition according to claim 1, which is curable by electron beam radiation, X-rays or other ionizing radiation.

7. The radiation curable liquid resin composition according to claim 1, further containing a heat-polymerization inhibitor.

8. The radiation curable liquid resin according to claim 7, containing a solvent for said matrix resin.

9. A resin composition according to claim 5, wherein the photosensitizer is benzoin, benzoin methyl ether, benzoin propyl ether, benzoin butyl ether, benzophenone, diacetyl, benzil, dibutyl disulfide or dibenzyl disulfide.

10. A resin composition according to claim 7, wherein the heat-polymerization inhibitor is hydroquinone, t-butylhydro-quinone, p-methoxyphenol, catechol or benzoquinone.

11. A resin composition according to claim 1, wherein said matrix resin therein comprises a monomer selected from the group consisting of styrene, vinyltoluene, divinylbenzene, vinyl acetate, (meth)acrylonitrile, methyl (meth)acrylate, ethyl (meth)acrylate, butyl (meth)acrylate, 2-ethylhexyl (meth)acrylate, glycidyl (meth)acrylate, ethyleneglycol di-(meth)acrylate, trimethylolpropane tri-(meth)acrylate, diethyl itaconate, dibutyl itaconate, diethyl fumarate and diethyl maleate.

* * * * *